(12) United States Patent
Ottens et al.

(10) Patent No.: US 7,639,345 B2
(45) Date of Patent: Dec. 29, 2009

(54) LITHOGRAPHIC APPARATUS

(75) Inventors: Joost Jeroen Ottens, Veldhoven (NL); Aschwin Lodewijk Hendricus Johannes Van Meer, Roosendaal (NL); Wim Tjibbo Tel, Helmond (NL); Jacob Willem Vink, Eindhoven (NL); Rene Theodorus Petrus Compen, Valkenswaard (NL); Petrus Johannes Gerrits, Mierlo (NL)

(73) Assignee: ASML Netherlands B.V., Veldhoven (NL)

( * ) Notice: Subject to any disclaimer, the term of this patent is extended or adjusted under 35 U.S.C. 154(b) by 430 days.

(21) Appl. No.: 11/252,230

(22) Filed: Oct. 18, 2005

(65) Prior Publication Data
US 2007/0085987 A1    Apr. 19, 2007

(51) Int. Cl.
*G03B 27/62* (2006.01)
*G03B 27/58* (2006.01)
(52) U.S. Cl. .......................................... 355/75; 355/72
(58) Field of Classification Search ................... 355/30, 355/52, 53, 72–76; 356/237.2
See application file for complete search history.

(56) References Cited
U.S. PATENT DOCUMENTS

| | | | |
|---|---|---|---|
| 5,559,582 A | 9/1996 | Nishi et al. | |
| 5,853,962 A | 12/1998 | Bowers | 430/331 |
| 6,198,982 B1* | 3/2001 | Park et al. | 700/121 |
| 6,950,176 B1* | 9/2005 | LaFontaine et al. | 355/75 |
| 6,951,502 B2* | 10/2005 | Koike et al. | 451/8 |
| 2005/0058836 A1 | 3/2005 | Goldstein | 428/411.1 |
| 2006/0203232 A1* | 9/2006 | Okita | 356/237.2 |

FOREIGN PATENT DOCUMENTS

| | | |
|---|---|---|
| EP | 1 037 117 A2 | 9/2000 |
| EP | 1 093 022 A2 | 4/2001 |
| EP | 1 093 022 A3 | 5/2004 |
| EP | 1 457 828 A2 | 9/2004 |
| JP | 2000-58494 | 2/2000 |
| JP | 2000-252187 | 9/2000 |
| JP | 2003-022993 | 1/2003 |
| JP | 2004-141704 | 5/2004 |
| KR | 2001-0066292 A | 7/2001 |
| KR | 2001-0083591 A | 9/2001 |

* cited by examiner

*Primary Examiner*—Hung Henry Nguyen
(74) *Attorney, Agent, or Firm*—Pillsbury Winthrop Shaw Pittman LLP

(57) ABSTRACT

The invention provides a height detecting apparatus for a lithographic apparatus. The height mapping apparatus includes a height mapping unit for providing at least one height map of a top surface of an object to be placed in a radiation beam of the lithographic apparatus, the object to be clamped by a clamping force applied thereto on a support constructed to support the object. The height mapping apparatus also includes a control unit for controlling the mapping unit to provide the at least one height map of the object relative to at least two different clamping pressure levels.

11 Claims, 6 Drawing Sheets

LITHOGRAPHIC APPARATUS

FIELD

The present invention relates to a lithographic apparatus and a height detecting apparatus for a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of one, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In current designs, a lack of wafer flatness and contamination on a wafer or generally on an object to be placed in a radiation beam, including but not restricted to substrates, wafers, fiducials and masks, negatively affects the imaging quality of the micropatterns that are imaged on target locations of the substrate. Likewise, contamination between the objects and supports that support the object while being irradiated can seriously impact imaging quality and cause deflection of the substrate.

Another problem affecting image resolution may be a damaged support structure, which, through wear or incidents, may have zones or specific spot locations that are not within specification for providing a flat support. However, the detection of such unflatnesses may be very difficult and time consuming.

Conventionally, a height map is used to drive the plane of focus of an imaging beam to provide well focused imaging at a desired height level. However, the height map created from a top surface of a (test) substrate can also be used to detect impurities as is illustrated in published European Patent Application Nos. EP1457828 or EP1093022. However, certain small impurities on the support structure can not be detected because they cause insufficient height variation. Yet, these impurities can cause distortion of the wafer which affects overlay accuracy and imaging quality.

U.S. Pat. No. 5,559,582 discusses a cleaning tool for cleaning impurities from a support structure. U.S. Pat. No. 6,198, 982 discusses an impurity detection method by sensing a height deviation from a reference plane. Published Japanese Patent Application No. JP2000/252187 discusses placement of a wafer at a reduced clamping pressure level for mitigating the generation of dust.

SUMMARY

It is desirable to provide a system and method to be better able to detect impurities on objects or a support that could affect image quality and overlay. To this end, the invention provides a height detecting apparatus for a lithographic apparatus. The height mapping apparatus includes a height mapping unit for providing at least one height map of a top surface of an object to be placed in a radiation beam of the lithographic apparatus, the object to be clamped by a clamping force applied thereto on a support constructed to support the object. The height mapping apparatus also includes a control unit for controlling the mapping unit to provide the at least one height map of the object relative to at least two different clamping pressure levels.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
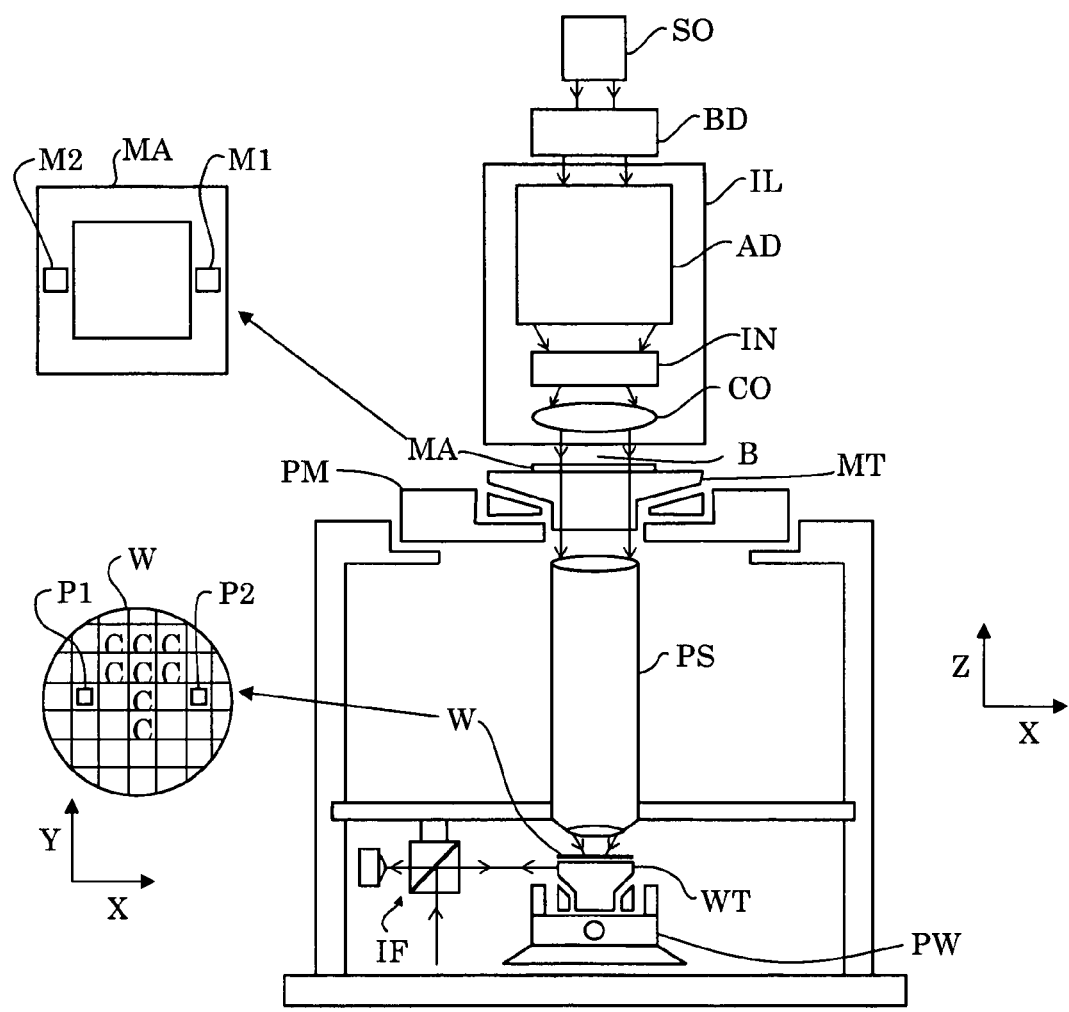
FIG. 1 depicts a lithographic apparatus according to an embodiment of the invention.

FIG. 1 schematically depicts a lithographic apparatus according to one embodiment of the invention. The apparatus comprises: an illumination system (illuminator) IL configured to condition a radiation beam B (e.g. UV radiation or deep UV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT supports, i.e. bears the weight of, the patterning device MA. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 2:
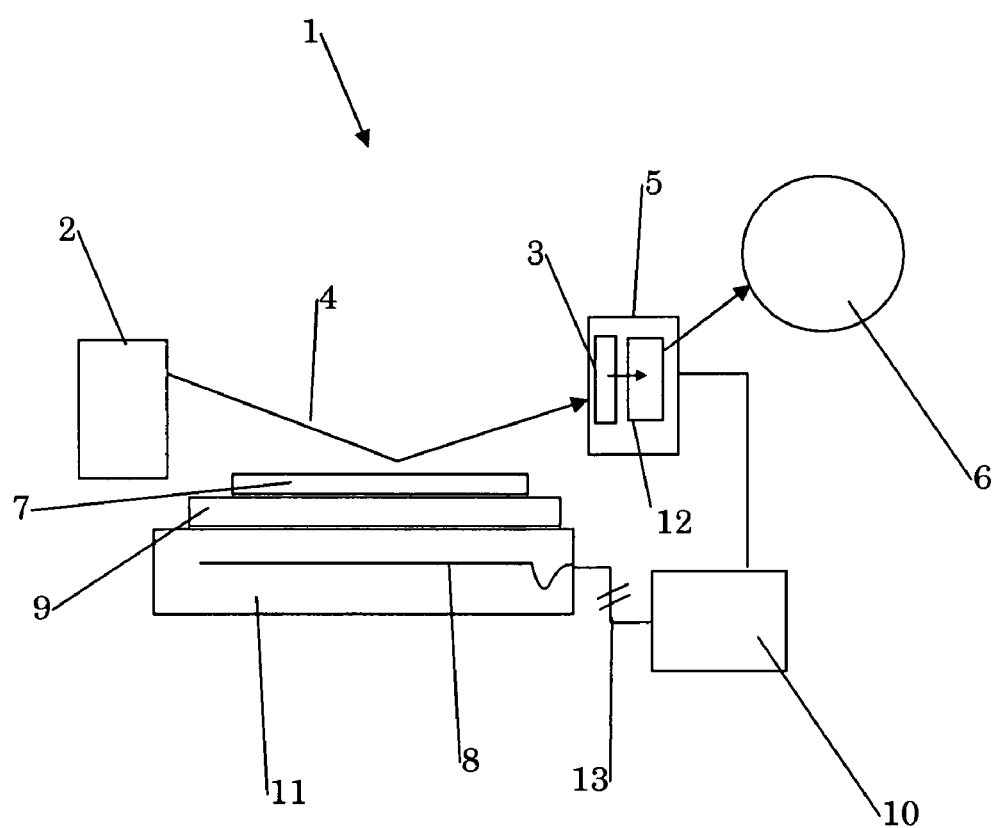
FIG. 2 depicts schematically a height detecting apparatus according to the invention.

FIG. 2 schematically shows a height detecting apparatus 1 in a lithographic apparatus. One example of a height detecting apparatus is known from published European Patent Application No. EP1037117 and comprises a transmitter unit 2 and a receiver unit 3 for transmitting and receiving, respectively, of a scanning light beam 4 reflecting on a top surface of an object to be measured, for providing height measurements of the top surface structure. According to the present invention, the height detecting apparatus 1 comprises a height mapping unit 5 for providing a height map 6 of a top surface of an object 7 to be clamped by a clamp 8 on a support structure 9 constructed to support said object 7 to be placed in a radiation beam of a lithographic apparatus, and a control unit 10 for controlling said mapping unit 5 to provide a height map 6 of said object 7 relative to at least two different clamping pressure levels. The support structure 9 is typically known as a wafer table, e.g., the substrate table WT of FIG. 1, or burl table, and typically comprises a plurality of protrusions for providing a generally flat support for the object to be placed thereon. In particular, for vacuum clamping, the support structure 9 is itself supported on a lower support structure 11 also known as mirror block. In principle, impurities and lacerations or (micro)damages can be present on both sides of the support structure 9.

As further demonstrated in FIG. 2, the height detecting apparatus 1 according to the invention comprises a processing circuit 12 in said height mapping unit 5 for providing, based on the output values of a receiver signal, the height map 6 by a series of per se known processing steps and calculations. Preferably, the processing circuit 12 comprises a memory unit (not shown) for storing a plurality of height maps at various pressure levels. From said height maps, in particular, from the difference between said height maps, impurities can be detected on said object 7 and/or support 9. The invention is applicable on a single clamping pressure level that is reduced relative to a normal clamping pressure level. While the object 7 is clamped on the support structure 9 with the reduced clamping pressure, impurities tend to be detected much better on the height map 6. Thus, the control unit 10 controls or detects a reduced clamping pressure level and controls the height detecting apparatus 1 to provide a height map 6. On the reduced clamping pressure level, impurities tend to be better detectable than at normal operating clamping pressure levels, since the normal operating clamping pressure tends to level the object 7 to a higher degree of flatness. A normal operating clamping pressure level tends to be about 500 mbar. A reduced operating clamping level is therefore a pressure level that ranges between 500 mbar and ambient pressure. Typically, the reduced clamping pressure level may already show a height variation due to stiffness variations at a relatively small pressure variation of about 50 mbar relative to the normal clamping pressure. For detectable absolute height variations due to impurities, the clamping pressure preferably is less than 200 mbar below ambient pressure.

Thus, at a lower clamping level, the wafer flatness tends to be less, specifically, the high frequency height variations tend to indicate impurities on the object 7 or support 9.

The invention is also applicable as a difference measurement detecting a relative height variation of the wafer on at least two differing clamping levels. Since the wafer deformation is depending on the stiffness, the variation of clamping pressure will result in a local height variation where the stiffness is locally changed. Such stiffness changes, especially the high frequency part thereof, indicate the presence of impurities. High-frequency variations, in contrast to low-frequency variations, indicate variations that are small compared to the object dimension, typically, in the order of object thickness. For a wafer, a typical bending length can be ~3 mm, i.e ~4× the object thickness. The factor 4 is dependent on the E-modulus and the thickness of the substrate and of the stiffness of the supporting burls.

Regarding the difference variation, the stiffness measurement may be indicative of the type of impurity and the position thereof. That is, a height variation indicating a relative high local stiffness is indicative of an impurity located at the backside of the support structure 9, that is, the side that is facing the lower support structure 11. In contrast, a height variation indicating a relative low local stiffness indicates an impurity located on the front side of the support structure 9, that is, the side facing the backside of the object 7. It will be appreciated that even for backside impurities, the detected local stiffness will also be lower than a generally clean area.

Also, the spot size of the impurity may also be indicative of the presence thereof, wherein larger spot sizes will be typically located on the backside, and smaller spot sizes will be present on the front side.

Furthermore, different stiffnesses may be indicative of the presence of a physical impurity particle (relative low stiffness), or the presence of an object defect or support defect (relative high stiffness).

As shown in FIG. 2, a connection 13 is drawn between the control unit 10 and the clamp 8 (which can be an electrostatic clamp). This connection 13 can also be another signal that is indicative of a reduced clamping pressure level. To this end, as an alternative, such a reduced clamping pressure level may be reached by providing the height measurement with a specifically designed flat test object or test substrate 7, having flatness characteristics well within predetermined flatness tolerances, to be placed on a vacuum clamp 8, which test object 7 allows a preset leak rate that reduces the clamping pressure level. In this way, without adjusting the clamping pressure level, a reduced clamping pressure level can be provided providing enhanced detection of impurities. Such test object 7 can also be provided for an electrostatic clamp 8, wherein the test object has modified clamping properties so that a reduced clamping pressure is provided between the test object and the electrostatic clamp 8.

Figure 3:
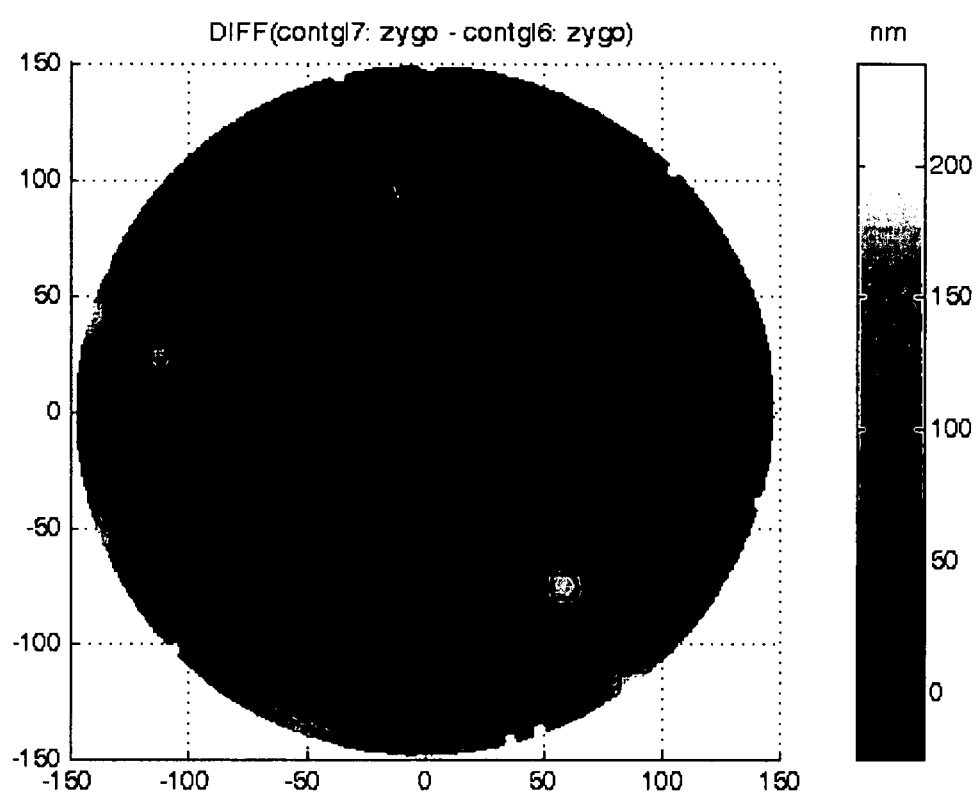
FIG. 3 depicts a difference map produced by height measurements at two differing clamping pressure levels.

FIG. 3 shows a difference height map of a flatness measurement at 500 mbar (which is a typical operating clamping pressure level) and a flatness measurement at a reduced clamping pressure level of 550 mbar clamping pressure. (It has to be borne in mind that the clamping pressure reduces on higher (gas) pressure levels). By measuring a wafer map at different vacuum pressures with the same wafer it is possible to distinguish between contamination (which typically has a lower stiffness) and the table itself by looking at the difference map between the two measurements. Contamination will typically show up very clearly in such a difference map, whereas the table flatness itself is independent of the vacuum pressure.

Figure 4:
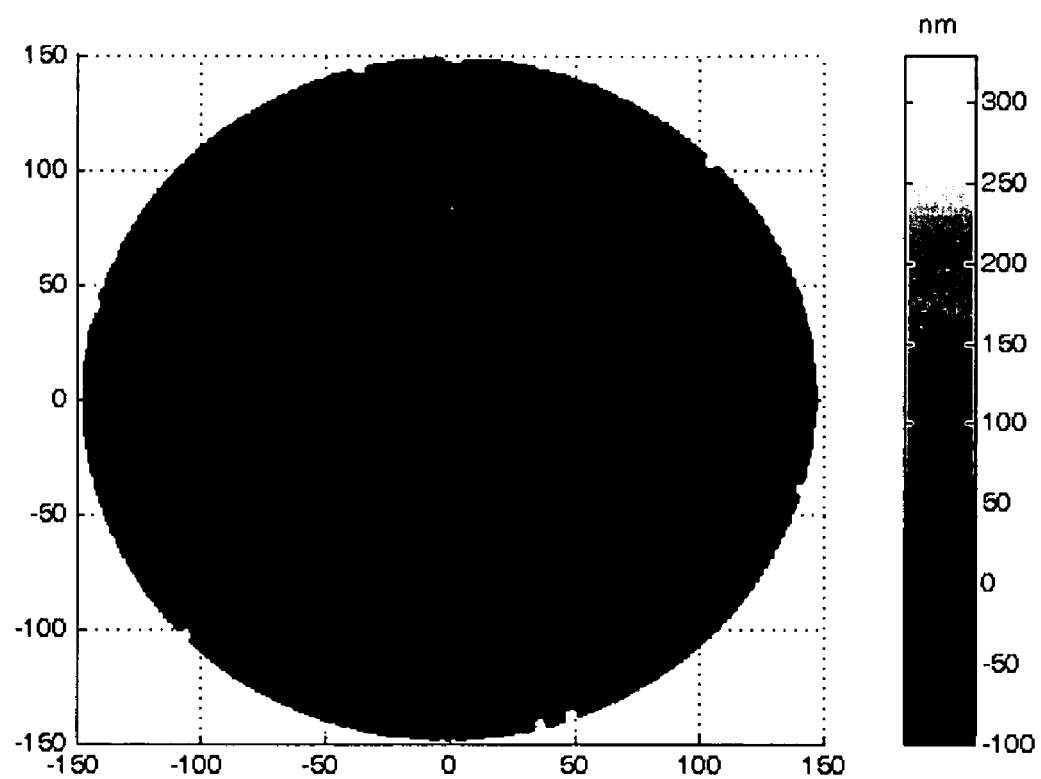
FIG. 4 and FIG. 5 show a height map produced at two different clamping pressure levels.
Figure 5:
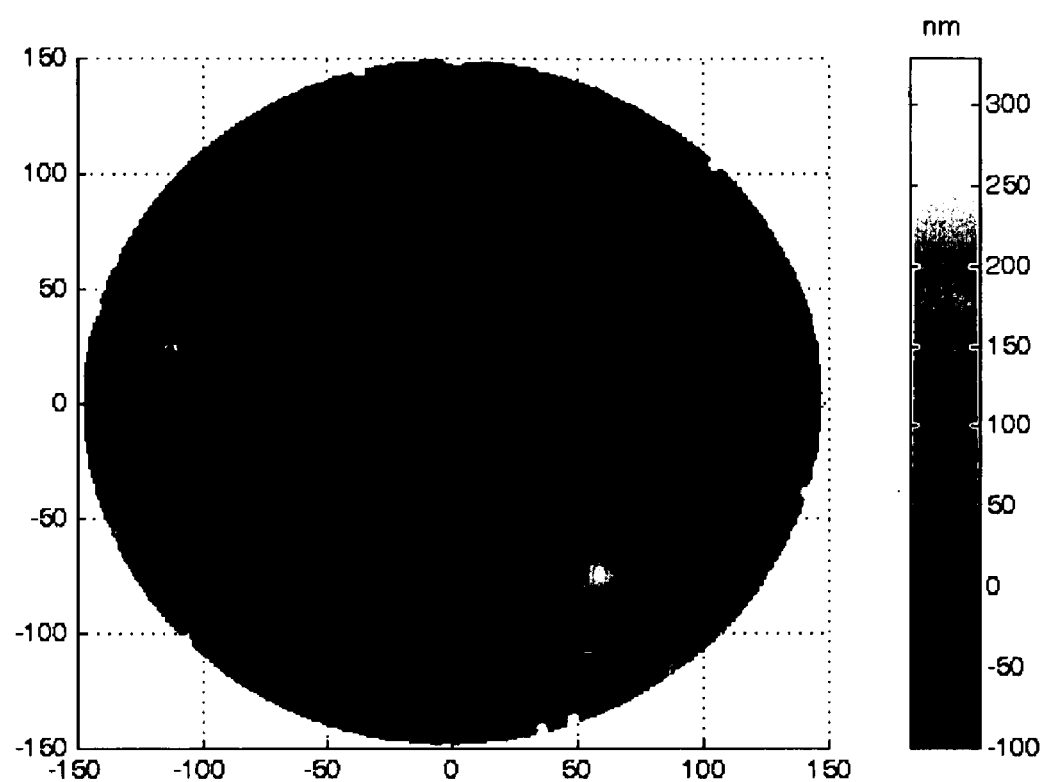

FIG. 4 and FIG. 5 show another illustration of the inventive concept, wherein here a first height map A is produced at a normal clamping level of 500 mbar below ambient pressure (−500 mbar). Height map B is produces at a weak vacuum level, of −60 mbar.

At this reduced clamping pressure level, impurities tend to be enlarged in diameter with a factor 2 to 5, thus, being able to be detected far more easily. The height maps were made with an Zygo interferometer. Using various levels of vacuum and analyzing the change in behavior of the various spots, analysis software can be constructed to estimate whether contamination is present on top- or back side of the wafer table. The spot-size will vary differently as a function of vacuum level because the influence of contamination on back-side will influence the height map via a different stiffness (wafer+wafer table) as contamination on top-side (wafer table only). Typical reduced clamping force levels will be 70% or less, for instance, in ranges of vacuum pressure levels between 0 and 450 mbar below ambient pressure.

Figure 6:
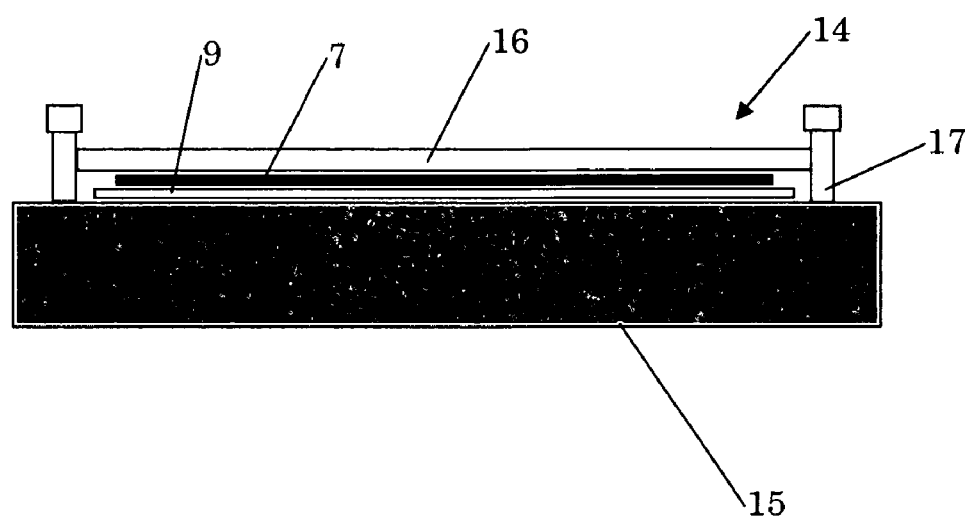
FIG. 6 shows a schematic embodiment of a test configuration for measuring a height map at a reduced clamping pressure level.

FIG. 6 shows another embodiment of the invention measuring at a reduced pressure level. In this embodiment, a height map can be detected visually or electronically through interference fringes visible on a diagnostic tool 14 which are caused by impurities present between a test object 7 and a support structure 9 (wafer table) supported on a movable wafer stage or mirror block 15. Assuming perfect flatness specifications of the test object 7, thus, an easy way of visually or electronically spotting contamination on a wafer table 9. This diagnostic tool 14 can be very easily used during cleaning of the lithographic apparatus, wherein a quick inspection method is provided that can measure the presence of impurities without setting up the machine to use the height mapping units of the lithographic machine itself. Specifically, the diagnostic tool 14 comprises a solid stiff transparent plate body or plan plate 16, which can be positioned by a positioning mechanism 17 level with respect to the test object. Thus, a test object 7 is clamped on the wafer table 9, which can be a leaking wafer, and the plan plate 16 is positioned thereabove. By visually or automatically inspecting the interference fringes, contamination detection can be carried out and a quality control measurement of the substrate table 9 can be provided.

Combinations and/or variations on the above described modes of use or entirely different modes of use may also be employed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" as used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A height detecting apparatus for a lithographic apparatus comprising:
a height mapping unit configured to provide at least one height map of a top surface of an object to be placed in a radiation beam of the lithographic apparatus, said object to be clamped by a clamping force applied thereto on a support structure constructed to support said object, and
a control unit configured to control said height mapping unit to provide a first height map of said object relative to a first clamping pressure level applied to said object, and a second height map of said object relative to a second clamping pressure level applied to said object that is different from the first clamping pressure level and is applied to said object at a different time.

2. A height detecting apparatus according to claim 1, wherein said height mapping unit comprises a processing circuit for providing said first height map on said first clamping pressure level and for providing said second height map on said second clamping pressure level, said second clamping pressure level being lower than said first clamping level so as to detect impurities on said object and/or said support structure by said height mapping unit at said second lower clamping pressure level.

3. A height detecting apparatus according to claim 2, wherein said processing circuit is provided with a subtraction circuit for calculating a difference between said first and second height maps so as to detect a relative height variation of the top surface of said object.

4. A height detecting apparatus according to claim 3, wherein said apparatus comprises a processing circuit for providing a plurality of height maps derived at a plurality of clamping pressure levels, said processing circuit provided with a memory for calculating a differential height and/or stiffness map based on said plurality of height maps stored in the memory.

5. A height detecting apparatus according to claim 2, wherein said height mapping unit is arranged to derive from said first height map and said second height map a local stiffness variation of the object, and comprises a unit for relating said stiffness variation to a position and size of an impurity.

6. A height detecting apparatus according to claim 1, wherein an impurity having a stiffness higher than a predetermined value is identified to reside on a backside of the object that is clamped on said support structure.

7. A height detecting apparatus according to claim 1, wherein an impurity having a stiffness lower than a predetermined value is identified to reside on a topside of the object facing a projection apparatus.

8. A height detecting apparatus according to claim 1, wherein said height detecting apparatus comprises a clamp for applying said clamping force, said support structure, and said object, and wherein said object and/or said clamp being configured to provide a clamping pressure at said first and second clamping pressure levels.

9. A height detecting apparatus according to claim 8, wherein said clamp is a vacuum clamp and said object is a flat object permitting a predetermined leak rate.

10. A height detecting apparatus according to claim 8, wherein said clamp is an electrostatic clamp.

11. A height detecting apparatus according to claim 8, wherein at least one of said first and second clamping pressure levels is reduced relative to a normal operating clamping pressure level.

* * * * *